(12) United States Patent
Gong et al.

(10) Patent No.: US 10,476,029 B2
(45) Date of Patent: Nov. 12, 2019

(54) PACKAGE STRUCTURE OF ORGANIC ELECTROLUMINESCENT DEVICE AND MANUFACTURING METHOD THEREOF, AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Kui Gong, Beijing (CN); Xianxue Duan, Beijing (CN); Wangwang He, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 16 days.

(21) Appl. No.: 15/817,770

(22) Filed: Nov. 20, 2017

(65) Prior Publication Data

US 2018/0309088 A1  Oct. 25, 2018

(30) Foreign Application Priority Data

Apr. 19, 2017 (CN) .......................... 2017 1 0258647

(51) Int. Cl.
*H01L 51/52* (2006.01)
*H01L 51/56* (2006.01)

(52) U.S. Cl.
CPC .......... *H01L 51/5253* (2013.01); *H01L 51/56* (2013.01); *H01L 2251/5338* (2013.01)

(58) Field of Classification Search
CPC ................. H01L 51/5253; H01L 51/56; H01L 2251/5338
See application file for complete search history.

(56) References Cited

U.S. PATENT DOCUMENTS

2004/0234766 A1  11/2004  Liu et al.
2010/0151209 A1*  6/2010  Wei .......................... C08J 7/04
428/189

(Continued)

FOREIGN PATENT DOCUMENTS

CN  103956373 A  7/2014
CN  105977398 A  9/2014

(Continued)

OTHER PUBLICATIONS

The First Chinese Office Action dated Feb. 26, 2018; Appln. No. 201710258647.8.

*Primary Examiner* — Nduka E Ojeh

(57) ABSTRACT

A package structure of an organic electroluminescent device and a manufacture method thereof, and a display device are provided. The package structure of the organic electroluminescent device includes a base substrate; an organic electroluminescent unit disposed on the base substrate; and a first inorganic protection layer, disposed on the organic electroluminescent unit. The first inorganic protection layer is provided with a first opening penetrating the first protection layer along a thickness direction, and the first opening is filled with a first organic material.

8 Claims, 6 Drawing Sheets

(56) References Cited

U.S. PATENT DOCUMENTS

| | | | |
|---|---|---|---|
| 2011/0198620 A1* | 8/2011 | Han | H05B 33/04 |
| | | | 257/88 |
| 2015/0102318 A1* | 4/2015 | Lee | H01L 51/5253 |
| | | | 257/40 |
| 2015/0102326 A1 | 4/2015 | An | |
| 2015/0171369 A1 | 6/2015 | Xie | |
| 2015/0214504 A1* | 7/2015 | Sonoda | H01L 51/5256 |
| | | | 257/40 |
| 2016/0043347 A1* | 2/2016 | Sun | H01L 51/5259 |
| | | | 257/40 |
| 2017/0005292 A1 | 1/2017 | Lee et al. | |
| 2017/0117504 A1 | 4/2017 | Kim et al. | |

FOREIGN PATENT DOCUMENTS

| | | |
|---|---|---|
| CN | 104576687 A | 4/2015 |
| CN | 104576959 A | 4/2015 |
| CN | 105206763 A | 12/2015 |
| CN | 106328671 A | 1/2017 |
| CN | 106450026 A | 2/2017 |
| CN | 206059394 U | 3/2017 |

* cited by examiner

PACKAGE STRUCTURE OF ORGANIC ELECTROLUMINESCENT DEVICE AND MANUFACTURING METHOD THEREOF, AND DISPLAY DEVICE

The present application claims priority to the Chinese patent application No. 201710258647.8 filed Apr. 19, 2017, the entire disclosure of which is incorporated herein by reference as part of the present application.

TECHNICAL FIELD

At least one embodiment of the present disclosure relates to a package structure of an organic electroluminescent device and a manufacturing method thereof, and a display device.

BACKGROUND

Organic electroluminescent devices have characteristics of self-luminescence, high brightness, wide viewing angle, flexibility and low energy consumption so as to attract much attention. An organic electroluminescent device comprises an advantage of obtaining flexible display, for example, a flexible organic electroluminescent panel may be obtained by using a flexible plastic substrate as a carrier in combination with a process of film packaging. Currently, a film packaging of an organic electroluminescent device mainly uses a laminated structure of a passivation layer and a buffer layer. The passivation layer usually uses an inorganic material, such as silicon nitride, etc., and the buffer layer usually uses an organic material and a partial organic material.

SUMMARY

At least one embodiment of the present disclosure provides a package structure of an organic electroluminescent device and a manufacture method thereof, and a display device.

At least one embodiment of the present disclosure provides a package structure of an organic electroluminescent device, which comprises a base substrate; an organic electroluminescent unit disposed on the base substrate; and a first inorganic protection layer disposed on the organic electroluminescent unit, wherein the first inorganic protection layer is provided with a first opening penetrating the first protection layer in a thickness direction, and the first opening is filled with a first organic material.

At least one embodiment of the present disclosure provides a manufacturing method of a package structure of an organic electroluminescent device, which comprises forming an organic electroluminescent unit on a base substrate; forming a first inorganic protection layer on the organic electroluminescent; forming a first opening penetrating the first inorganic protection layer in a thickness direction in the first inorganic protection layer; and filling a first organic material in the first opening.

At least one embodiment of the present disclosure provides a display device, which comprises any package structure of an organic electroluminescent device provided by at least one embodiment of the present disclosure.

BRIEF DESCRIPTION OF THE DRAWINGS

In order to clearly illustrate the technical solution of embodiments of the present disclosure, the drawings of the embodiments or related technical description will be briefly described in the following; it is obvious that the drawings in the description are only related to some embodiments of the present disclosure and not limited to the present disclosure.

FIG. 1b is a top view of a first inorganic protection layer in the package structure of the organic electroluminescent device illustrated in FIG. 1a;

FIG. 1c is a top view of a first inorganic protection layer in another package structure of an organic electroluminescent device illustrated in FIG. 1a;

FIG. 2b is a top view of a second inorganic protection layer in the package structure of the organic electroluminescent device illustrated in FIG. 2a;

FIG. 2c is a top view of a second inorganic protection layer in another package structure of an organic electroluminescent device illustrated in FIG. 2a;

DETAILED DESCRIPTION

Figure 1A:
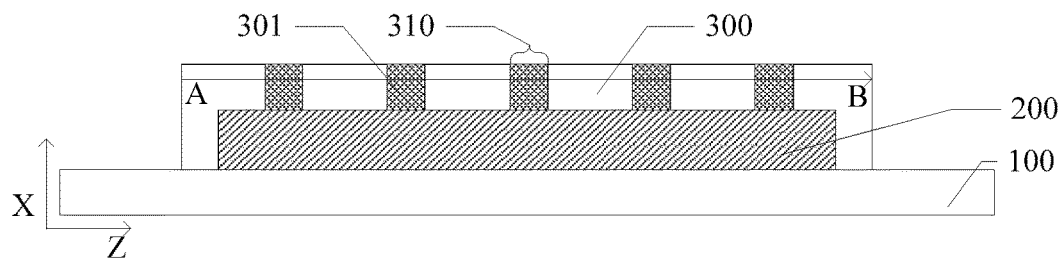
FIG. 1a is a sectional view of a package structure of an organic electroluminescent device provided by an embodiment of the present disclosure.

In order to make objects, technical details and advantages of the embodiments of the present disclosure apparently, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, a person having ordinary skill in the art may obtain other embodiment(s), without any inventive work, which should be within the scope of the disclosure.

Unless otherwise defined, the technical terms or scientific terms used herein have the same meanings as commonly understood by a person having ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," etc., are intended to specify that the elements or the objects stated before these terms encompass the elements or the objects and equivalents thereof listed after these terms, but do not preclude the other elements or objects. "Over," "under," "right," "left" and the like are only used to indicate relative position relationship, and when the position of the object which is described is changed, the relative position relationship may be changed accordingly.

In a study, the inventors of the application have found that a passivation layer in a package structure of an organic electroluminescent usually uses an inorganic material. In a case that a passivation layer formed by the inorganic material has a thicker thickness, the passivation layer is subjected to larger stress, and then it is easy to be broken during a bending process, which makes oxygen and moisture erode an organic electroluminescent unit through a crack generated.

At least one embodiment of the present disclosure provides a package structure of an organic electroluminescent device and a manufacturing method thereof, and a display device. The package structure of the organic electroluminescent device comprises a base substrate, an organic electroluminescent unit disposed on the base substrate and a first inorganic protection layer disposed on the organic electroluminescent unit. The first inorganic protection layer is provided with a first opening penetrating the first protection layer in a thickness direction, and the first opening is filled with a first organic material. Therefore, in a case that the entire package structure is bent by force, a fracture possibility of the first inorganic protection layer may be reduced, so as to increase bending performance of the organic electroluminescent device.

Hereafter, a package structure of an organic electroluminescent device and a manufacturing method thereof, and a display device provided in an embodiment of the present disclosure will be described below with reference to the drawings.

The present embodiment provides a package structure of an organic electroluminescent device, FIG. 1a is a sectional view of a package structure of an organic eletroluminescent device, as illustrated in FIG. 1a, the package structure of the organic electroluminescent device comprises a base substrate 100, an organic electroluminescent unit 200 disposed on the base substrate 100 and a first inorganic protection layer 300 disposed on the organic electroluminescent unit 200. The first inorganic protection layer 300 is provided with a first opening 310 penetrating the first protection layer 300 in a thickness direction, and the first opening 310 is filled with a first organic material 301. The thickness direction here is X direction illustrated in FIG. 1a. In the present embodiment, the first inorganic protection layer is provided with the first opening penetrating the first inorganic protection layer, and the first opening is filled with the first organic material, therefore, in a case that the entire package structure is bent by force, a fracture possibility of the first inorganic protection layer may be reduced, so as to increase a bending performance of an organic electroluminescent device. It should be noted that, comparing with a non-penetrating opening, the first opening penetrating the first inorganic protection layer in the present embodiment is capable of making the entire package structure obtain better bending performance.

For example, the base substrate 100 may be made of one or more materials selected from the group consisted of polyimide, polycarbonate, polyacrylate, polyetherimide, polyethersulfone, polyethyleneterephthalate, and polyethylenenaphthalate, but not limited thereto.

For example, the organic electroluminescent unit 200 comprises a cathode, an anode and a functional layer disposed between the cathode and the anode.

For example, the functional layer comprises a light emitting layer, and further comprises at least one of a hole transport layer, a hole injection layer, a hole blocking layer, an electron transport layer, an electron injection layer and an electron blocking layer, but not limited thereto.

For example, the cathode in the organic electroluminescent unit 200 may be formed of a material having high electrical conductivity and a low work function. For example, the cathode may be made of a metal material, but not limited thereto.

For example, the anode in the organic electroluminescent unit 200 may be formed of a transparent conductivity material having a high work function. For example, the anode may be formed of one or more of indium zinc oxide, indium tin oxide, indium tin zinc oxide or tin oxide, but not limited thereto. The hole provided by the anode and the electron provided by the cathode in the organic electroluminescent unit are subjected to recombination at the light emitting layer to emit light.

For example, the first inorganic protection layer 300 may comprise an inorganic material such as metal oxide, metal sulfide or metal nitride, but not limited thereto.

For example, the metal oxide may comprise calcium oxide, zinc oxide, copper oxide, titanium dioxide, zirconium dioxide, tin dioxide, and the like; the metal sulfide may comprise iron sulfide, copper sulfide, zinc sulfide, lead sulfide, tin disulfide and the like; the metal nitride may comprise silicon nitride, and aluminum nitride, etc., but not limited thereto. The first inorganic protection layer provided by the present embodiment made of an inorganic material may have a higher density, and a better barrier effect on moisture and oxygen.

For example, the first organic material 301 filled in the first opening 310 may comprise one or more selected from the group consisted of polyimide, polyamide, polycarbonate, polystyrene, polyvinyl chloride, polyethylene, polypropylene, polyethylene terephthalate, poly-p-phenylethyl sulfone, polymethylmethacrylate, polyethylene naphthalate, polysulfone, epoxy resin, but not limited thereto. In the present embodiment, the bending performance of the entire package structure may be increased by filling the first inorganic protection layer with the organic material having elasticity, so as to ensure that the package structure may not be broken under bending force due to large stress of the first inorganic protection layer, and improve the flexibility of the display device.

Figure 1B:
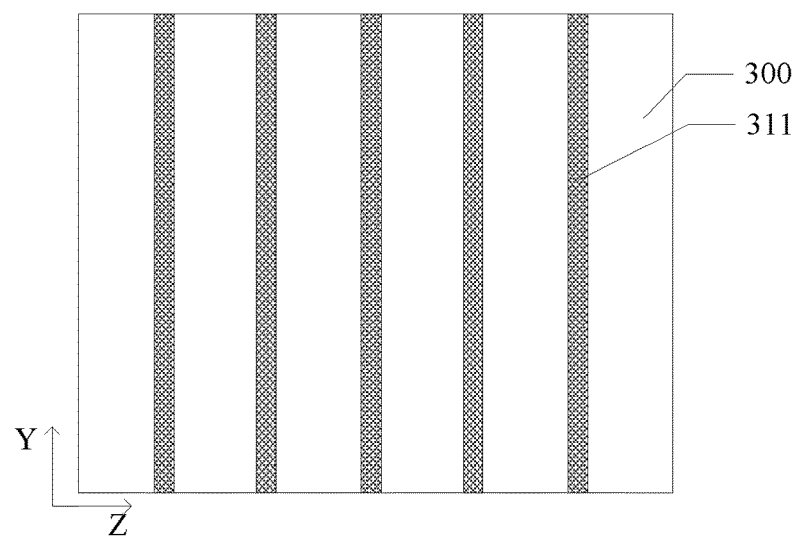

For example, FIG. 1b is a top view of a first inorganic protection layer along AB direction in the package structure of the organic electroluminescent device illustrated in FIG. 1a. As illustrated in FIG. 1b, the first opening 310 disposed in the first inorganic protection layer 300 comprises a plurality of first strip-shaped openings 311 extending along Y direction and arranged in Z direction, and the first strip-shaped openings 311 are filled with the first organic material 301. The present example is described by taking a case that the first strip-shaped openings 311 extending along Y direction and are arranged in Z direction, but not limited thereto. The distribution of the plurality of first strip-shaped openings 311 provided by the present example is capable of decreasing a fracture probability and improving the bending performance of the first inorganic protection layer 300 of the package structure in Z direction. It should be noted that, the extension of the first strip-shaped openings in Y direction is not limited to a case that the first strip-shaped openings penetrate the first inorganic protection layer in Y direction as illustrated in FIG. 1b, for example, the first strip-shaped openings may not penetrate the first inorganic protection layer along Y direction.

For example, because the plurality of first strip-shaped openings 311 divide the first inorganic protection layer 300 into a plurality strip-shaped first inorganic protection layer sub-portions along Z direction, in a case that the package structure is bent by the force parallel to Z direction, the first inorganic protection layer may not be broken due to its large stress, thereby the package structure improves the bending performance along Z direction. It should be noted that, the first inorganic protection layer provided by the present example is suitable for the package structure to be only subjected to force in one direction, and the direction of the force applied on the package structure is perpendicular to, the extending direction of the first strip-shaped openings.

Figure 1C:
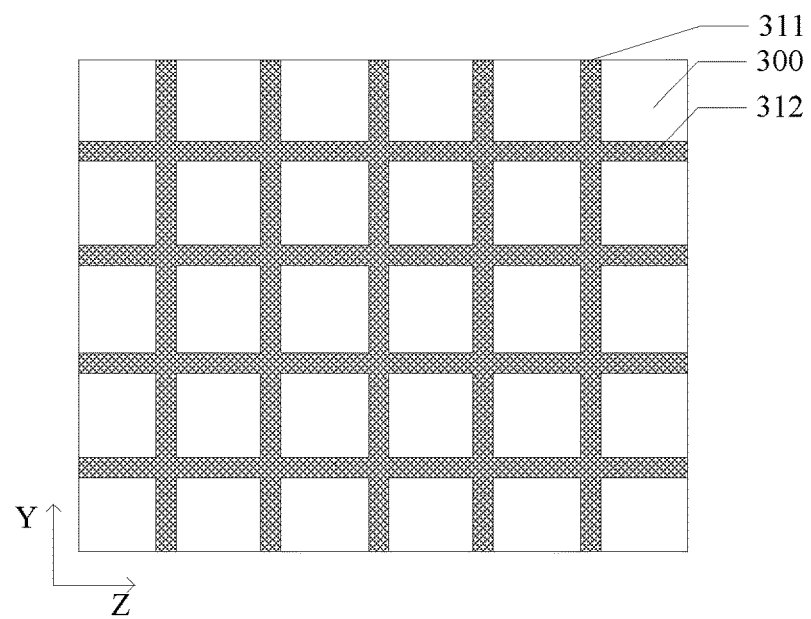

For example, FIG. 1c is a top view of a first inorganic protection layer along AB direction in another package structure of an organic electroluminescent device illustrated in FIG. 1a. As illustrated in FIG. 1c, the first opening 310 comprises a plurality of first strip-shaped openings 311 extending along a first direction parallel to the base substrate and a plurality of second strip-shaped openings 312 extending along a second direction parallel to the base substrate, the first direction intersects with the second direction. Here, "the first direction" and "the second direction" are respectively Y direction and Z direction illustrated in FIG. 1c. The present example is described by taking a case that the first direction and the second direction are respectively along the two intersecting side lengths of the first inorganic protection layer. For example, the first direction is perpendicular to the second direction, but the present example is limited to this. For example, the first direction may not be perpendicular to the second direction.

For example, as illustrated in FIG. 1c, the present embodiment is described by taking a case that the plurality of first strip-shaped openings 311 and the plurality of second openings 312 intersect with each other to form a mesh structure, the first strip-shaped openings 311 and the second strip-shaped openings 312 are filled with the first organic material 301. The arrangement of the plurality of first strip-shaped openings 311 and the plurality of second strip-shaped openings 312 is capable of decreasing a fracture probability in the first inorganic protection layer 300 in Y direction and Z direction, even in any other direction, and improving the bending performance in the first inorganic protection layer in all directions.

For example, in a case that the package structure is subjected to a force extending along any direction, because of the first strip-shaped openings 311 and the second strip-shaped openings 312 divide the first inorganic protection layer 300 into a plurality of blocks of first inorganic protective sub-portions respectively in Y direction and Z direction, therefore, in a case that the package structure is bent by the force, the first inorganic protection layer may not break due to its large stress, that is, the mesh structure formed in the present example increases the number of bendable points of the first inorganic protection layer, so as to improve the bending performance of the package structure and better ensuring the bending resistance performance of the flexible organic electroluminescent device. The present embodiment is not limited to this.

For example, the plurality of first strip-shaped openings and the plurality of second strip-shaped openings may also respectively extend along Y direction and Z direction but do not intersect with each other.

For example, it is also possible that the plurality of first strip-shaped openings and the second strip-shaped openings located in a display area intersect with each other to form a mesh structure while the plurality of first strip-shaped openings and the second strip-shaped openings located in a peripheral area around the display area do not intersect with each other, so as to ensure that the first inorganic protection layer located in the display area may not be broken due to its own stress. The present embodiment does not limit this.

Figure 1D:
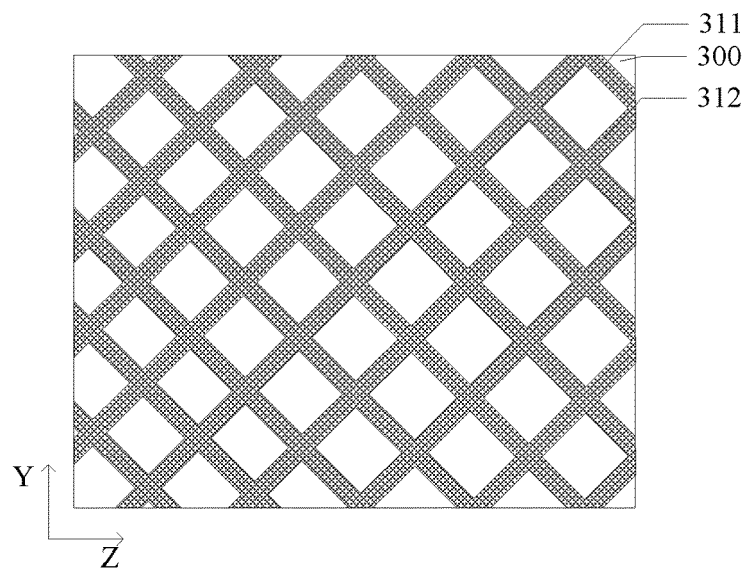
FIG. 1d is a top view of a first inorganic protection layer in another package structure of an organic electroluminescent device provided by an embodiment of the present disclosure.

For example, FIG. 1d is a top view of a first inorganic protection layer in another package structure provided by the present embodiment. As illustrated in FIG. 1d, the first opening 310 comprises a plurality of first strip-shaped openings 311 extending along a first direction and a plurality of second strip-shaped openings 312 extending along a second direction, the first direction intersects with the second direction. Here, "the first direction" and "the second direction" are any two intersecting directions that are not parallel to Y direction and Z direction. The package structure of an organic electroluminescent device provided by the present example is capable of achieving the same effect as the package structure of an organic electroluminescent device illustrated in FIG. 1c.

Figure 2A:
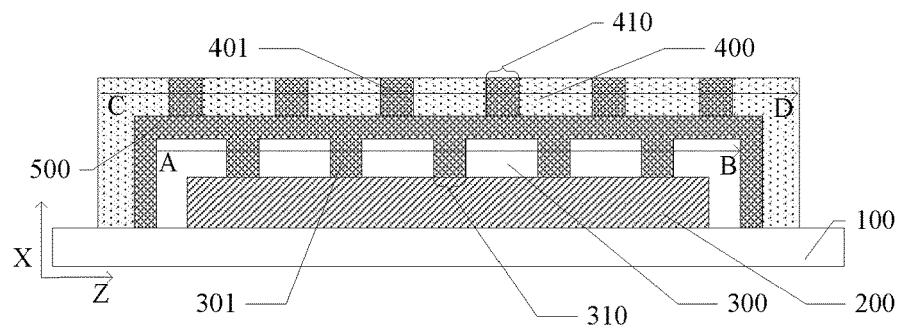
FIG. 2a is a sectional view of a package structure of an organic electroluminescent device provided by an embodiment of the present disclosure.

For example, FIG. 2a is a sectional view of a package structure of an organic electroluminescent device provided by the present embodiment, as illustrated in FIG. 2a, the package structure of the organic electroluminescent device provided by the present embodiment further comprises a second inorganic protection layer 400 disposed on the first inorganic protection layer 300, that is, the second inorganic protection layer 400 is disposed on a side of the first inorganic protection layer 300 facing away from the base substrate 100. The second inorganic protection layer 400 is provided with a second opening 410 penetrating the second inorganic protection layer 400 in the thickness direction, that is, X direction, and the second opening 410 is filled with a second organic material 401. In the present embodiment, the second inorganic protection layer is provided with the second opening penetrating the second protection layer, and the second opening is filled with the second organic material, therefore, in a case that the package structure is bent by force, a fracture possibility of the second inorganic protection layer may be reduced, so as to improve the bending performance of an organic electroluminescent device. It should be noted that, comparing with a non-penetrating opening, the second opening penetrating the second inorganic protection layer in the present embodiment is capable of making the entire package structure obtain better bending performance.

For example, the material of the second inorganic protection layer 400 may be silicon nitride with a good barrier effect on moisture and oxygen, but not limited thereto.

For example, the second organic material 401 filled in the second opening 410 may be the same flexible organic material as the first organic material 301, and may also include other organic materials with better elasticity, the present embodiment dose not limited this. In the present embodiment, the bending performance of the entire package structure may be improved by filling the second inorganic protection layer with the organic material having elasticity, so as to ensure that the package structure may not break under bending force due to large stress of the second inorganic protection layer, and improving the flexibility of the display device.

Figure 2B:
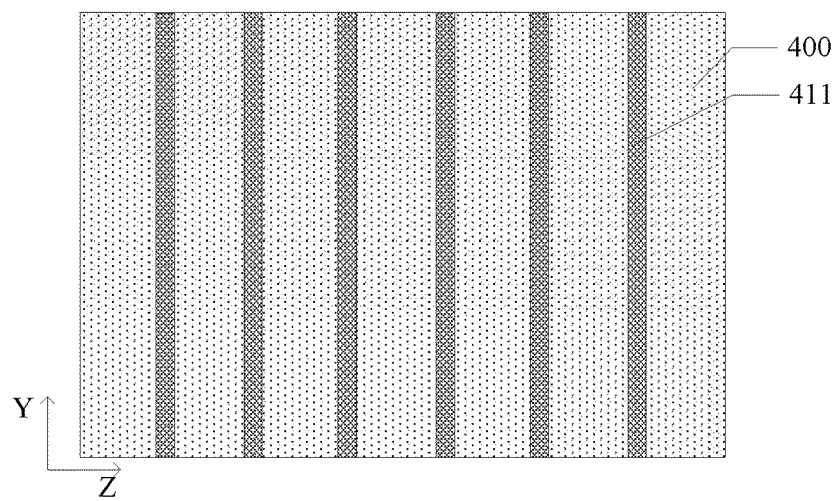

For example, FIG. 2b is a top view of a second inorganic protection layer along CD direction in a package structure of an organic electroluminescent device illustrated in FIG. 2a. As illustrated in FIG. 2b, the second opening 410 disposed in the second inorganic protection layer 400 comprises a plurality of third strip-shaped openings 411 extending along Y direction and arranged in Z direction, and the third strip-shaped openings 411 are filled with the second organic material 401. The present example is described by taking a case that the third strip-shaped openings 411 extend along Y direction and are arranged in Z direction, but is not limited to this. The plurality of third strip-shaped openings 411 provided by the present example are similar to the plurality of first strip-shaped openings 311 illustrated in FIG. 1b, the plurality of third strip-shaped openings is capable of decreasing a fracture probability and improving the bending performance in the second inorganic protection layer 400 of the package structure in Z direction. It should be noted that, the combination of the second inorganic protection layer provided by the present example with the first inorganic protection layer illustrated in FIG. 1b is suitable for the package structure being subjected only to force in one direction, and the direction of the force applied to the package structure is perpendicular to the extending direction of the third (first) strip-shaped openings.

Figure 2C:
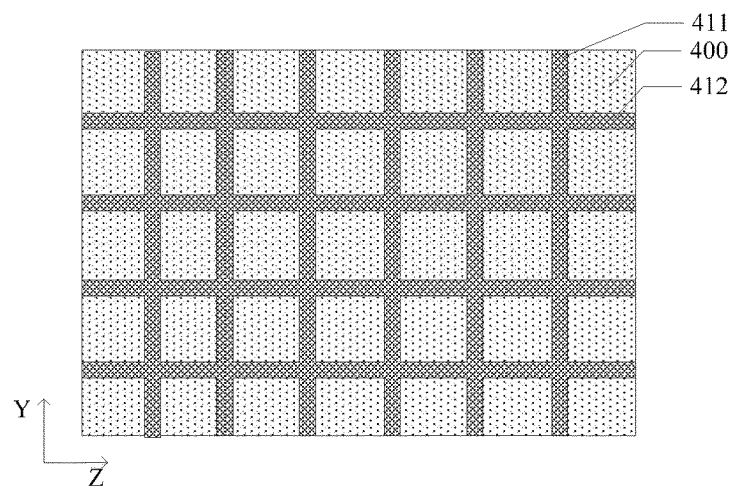

For example, FIG. 2c is a top view of a second inorganic protection layer along CD direction in another package structure of an organic electroluminescent device illustrated in FIG. 2a. As illustrated in FIG. 2c, the second opening 410 comprises a plurality of third strip-shaped openings 411 extending along a first direction, that is Y direction parallel to the base substrate and a plurality of fourth strip-shaped openings 412 extending along a second direction, that is Z direction parallel to the base substrate, the first direction intersects with the second direction. The present example is described by taking a case that the first direction and the second direction are respectively along the two intersecting side lengths of the second inorganic protection layer. For example, the first direction is perpendicular to the second direction. The present example includes but is not limited to this, for example, the first direction may not be perpendicular to the second direction.

For example, as illustrated in FIG. 2c, the present embodiment is described by taking a case that the plurality of third strip-shaped openings 411 and the plurality of fourth openings 412 intersect with each other to form a mesh structure, the third strip-shaped openings 411 and the fourth openings 412 are filled with the second organic material 401. The mesh structure formed by the plurality of third strip-shaped openings 411 and the plurality of fourth strip-shaped openings 412 is similar to the mesh structure formed by the plurality of first strip-shaped openings 311 and the plurality of second strip-shaped openings 312 illustrated in FIG. 1c, and has the same effect, that is, the mesh structure formed by the plurality of third strip-shaped openings 411 and the plurality of fourth strip-shaped openings 412 is capable of decreasing a fracture probability in the second inorganic protection layer 400 in Y direction and Z direction, even in any other direction, and improving the bending performance in the second inorganic protection layer in all directions. The combination of the second inorganic protection layer and the first inorganic protection layer illustrated in FIG. 1c increases the number of bendable points of the first inorganic protection layer and the second inorganic protection layer, so as to improve the bending performance of the package structure and better ensuring the bending resistance performance of the flexible organic electroluminescent device. The present embodiment includes but is not limited to this.

For example, the plurality of third strip-shaped openings and the plurality of fourth strip-shaped openings may also respectively extend along Y direction and Z direction but do not intersect with each other.

For example, it is also possible that the plurality of third strip-shaped openings and the fourth strip-shaped openings located in a display area intersect with each other to form a mesh structure while the plurality of third strip-shaped openings and the fourth strip-shaped openings located in a peripheral area around the display area do not intersect with each other, so as to insure that the second inorganic protection layer located in the display area may not be broken due to its own stress, the present embodiment does not limit this.

Figure 2D:
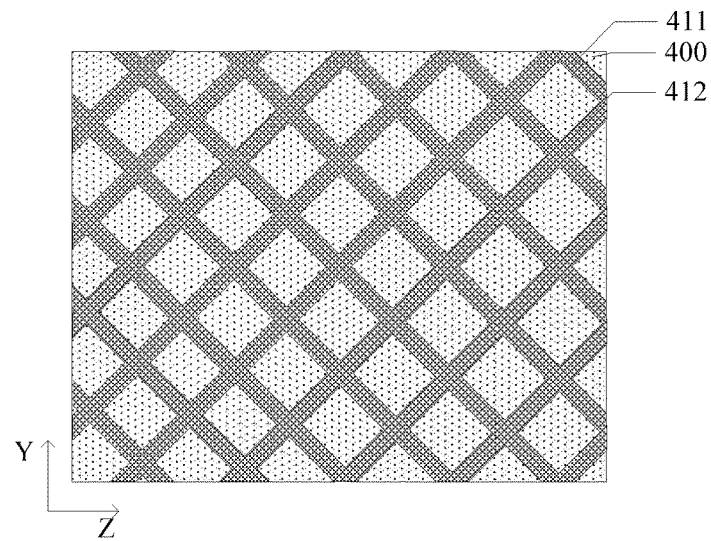
FIG. 2d is a top view of a second inorganic protection layer in another package structure of an organic electroluminescent device provided by an embodiment of the present disclosure.

For example, FIG. 2d is a top view of a second inorganic protection layer in another package structure of an organic electroluminescent device provided by the present embodiment. As illustrated in FIG. 2d, the second inorganic protection layer 400 has a similar pattern to the first inorganic protection layer 300 illustrated in FIG. 1d, and the second inorganic protection layer 400 has the same effect to the first inorganic protection layer 300, but not limited thereto.

Figure 3A:
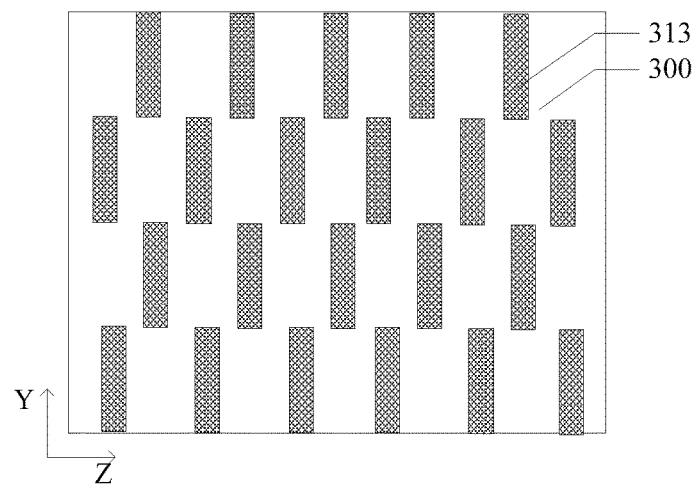
FIG. 3a and FIG. 3b are respectively a top view of a first inorganic protection layer and a second protection layer in another package structure of an organic electroluminescent device provided by an embodiment of the present disclosure.
Figure 3B:
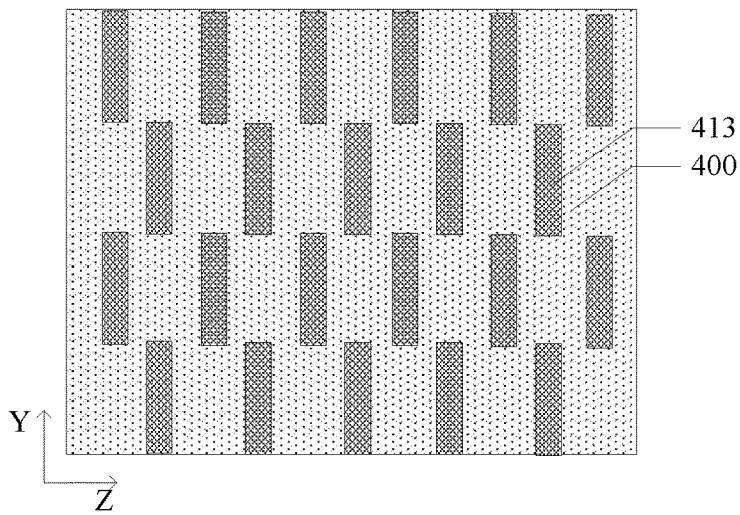

For example, FIG. 3a and FIG. 3b are respectively a top view of a first inorganic protection layer and a second inorganic protection layer in another package structure of an organic electroluminescent device provided by an embodiment of the present disclosure. As illustrated in FIG. 3a, the first opening 310 comprises a plurality of first sub-openings 313 arranged in a plurality of rows, that is, the first opening 310 comprises a plurality of the first sub-openings 313 spaced apart along Z (row) direction, and the first openings 310 comprises a plurality of rows of first sub-openings 313 in Y direction. As illustrated in FIG. 3a, the first sub-openings 313 of adjacent rows are offset from each other in the row direction. It should be noted that, the positional relationship of the first sub-openings 313 of adjacent rows and the dimensions of the first sub-openings 313 in Z direction are only exemplary, the present embodiment dose not limit this.

For example, as illustrated in FIG. 3b, the second opening 410 comprises a plurality of second sub-openings 413 arranged in a plurality of rows, that is, the second opening 410 comprises a plurality of the second sub-openings 413 spaced apart along Z (row) direction, and the second opening 410 comprises a plurality of rows of second sub-openings 413 in Y direction. As illustrated in FIG. 3b, the second sub-openings 413 of adjacent rows are offset from each other in the row direction.

It should be noted that, the present example is described by taking a case that the plurality of the first sub-openings are offset from each other in a row direction and the plurality of second sub-openings are also offset from each other in the row direction. The present embodiment includes but is not limited to this. For example, at least one of the first sub-openings and the second sub-openings of adjacent rows is offset from each other in the row direction.

It should be noted that, a pattern of the first opening in the first inorganic protection layer provided by the present embodiment may be the same as a pattern of the second inorganic protection layer, and the pattern of the first opening in the first inorganic protection layer provided by the present embodiment may also be different from the pattern of the second inorganic protection layer, the present embodiment dose not limit this. As long as the package structure is under the combined influence of the first opening and the second opening penetrating the first inorganic protection layer and the second inorganic protection layer, a fracture possibility of the first inorganic protection layer and the second inorganic protection layer may be reduced, so as to improve bending performance of the package structure, and better ensuring the bending resistance performance of the flexible organic electroluminescent device.

For example, as illustrated in FIG. 2a, an orthogonal projection of the second opening 410 on the base substrate 100 is offset from an orthogonal projection of the first opening 310 on the base substrate 100, that is, the orthogonal projection of the second opening 410 on the base substrate 100 and the orthogonal projection of the first opening 310 on the base substrate 100 do not overlap. The package structure of an organic electroluminescent device provided by the present embodiment may reduce the fracture possibility of the first inorganic protection layer and the second inorganic protection layer, so as to improve bending performance of the package structure and better ensuring the bending resistance performance of the flexible organic electroluminescent device. And the package structure of the organic electroluminescent device provided by the present embodiment may also increase a path of moisture and oxygen erosion, so as to prevent external moisture and oxygen intrusion maximally. The present embodiment includes but is not limited to this. For example, the orthogonal projection of the second opening on the base substrate and the orthogonal projection of the first opening on the base substrate may also be overlapped.

For example, as illustrated in FIG. 2a, the package structure of an organic electroluminescent device further comprises a buffer layer 500, which is disposed between the first inorganic protection layer 300 and the second inorganic protection layer 400.

For example, a material of the buffer layer 500 is the same as the first organic material 301, therefore, process steps may be saved in the production process, but not limited thereto.

For example, the material of the buffer layer 500 is the same as the first organic material 301 and the second organic material 401, so as to simplify the process, but not limited thereto.

For example, the material of the buffer layer 500 is the same as at least one of the first organic material 301 and the second organic material 401.

For example, as illustrated in FIG. 2a, the first inorganic protection layer 300 is disposed on a surface of the organic electroluminescent unit 200 facing away from the base substrate 100 and the lateral sides of the organic electroluminescent unit 200, the buffer layer 500 is disposed on a surface of the first inorganic protection layer 300 facing away from the base substrate 100 and the lateral sides of the first inorganic protection layer 300, the second inorganic protection layer 400 is disposed on a surface of the buffer layer 500 facing away from the base substrate 100 and the lateral sides of the buffer layer 500.

It should be noted that, the present embodiment is described by taking a case that the package structure comprises a laminated structure of the first inorganic protection layer, the buffer layer and the second inorganic protection layer, but the present embodiment does not limit this. For example, the number of the inorganic protection layer and the buffer layer may be increased according to an actual situation.

Figure 4:
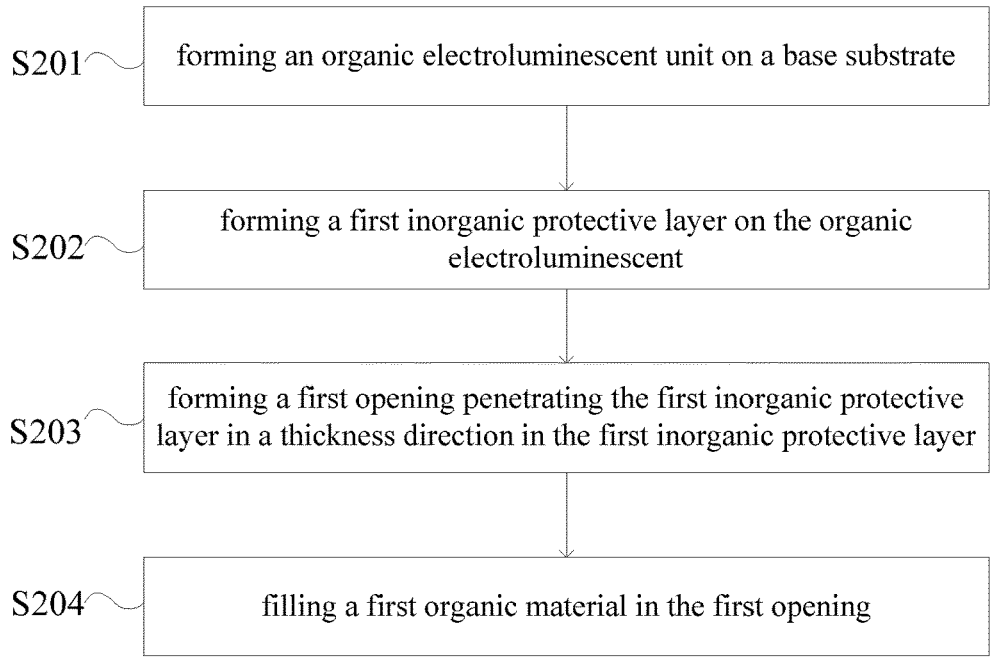
FIG. 4 is a flowing chart of a manufacturing method of a package structure of an organic electroluminescent device provided by an embodiment of the present disclosure.

The present embodiment provides a manufacture method of a package structure of an organic electroluminescent device, specific steps of the manufacturing method are illustrated in FIG. 4, and diagrams for illustrating the process of the manufacturing method is illustrated in FIG. 5a to FIG. 5h. As illustrated in FIG. 4 and FIG. 5a to FIG. 5h, the manufacturing method of a package structure of an organic electroluminescent device comprises the following steps:

S201: Forming an organic electroluminescent unit 200 on a base substrate 100.

For example, a material of the base substrate 100 may be made of one or more materials of polyimide, polycarbonate, polyacrylate, polyetherimide, polyethersulfone, polyethyleneterephthalate, and polyethylenenaphthalate, but not limited thereto.

For example, the organic electroluminescent unit 200 comprises a cathode, an anode and a functional layer disposed between the cathode and the anode.

For example, the functional layer comprises a light emitting layer, and further comprises at least one of a hole transport layer, a hole injection layer, a hole blocking layer, an electron transport layer, an electron injection layer and an electron blocking layer, but not limited thereto. The hole provided by the anode and the electron provided by the cathode in the organic electroluminescent unit 200 are subjected to recombination at the emitting layer to emit light.

S202: Forming a first inorganic protection layer 300 on the organic electroluminescent unit 200.

Figure 5A:
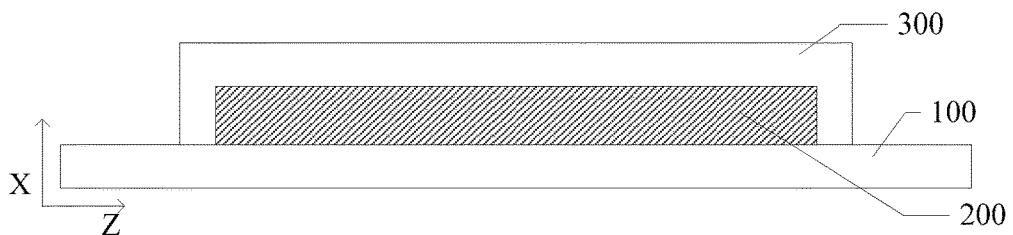
FIG. 5a to FIG. 5h is diagrams illustrating a process for a package structure of an organic electroluminescent device provided by an embodiment of the present disclosure.

For example, as illustrated in FIG. 5a, the first inorganic protection layer 300 is formed on a surface of the organic electroluminescent unit 200 facing away from the base substrate 100 and the lateral sides of the organic electroluminescent unit 200.

For example, the first inorganic protection layer 300 may comprise an inorganic material such as metal oxide, metal sulfide or metal nitride, the present embodiment dose not limit this. The first inorganic protection layer 300 provided by the present embodiment made of an inorganic material may have a higher density, and a better barrier effect on moisture and oxygen.

Figure 5B:
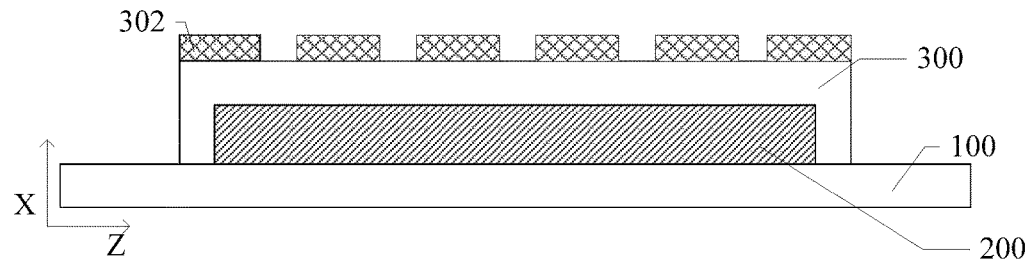

For example, as illustrated in FIG. 5b, the present embodiment is described by taking a case that coating a photoresist mask layer on the first inorganic protection layer 300, but is not limited to this. A first mask layer 302 is formed on the first inorganic protection layer 300 by means of exposure and development. The first mask layer 302 may comprise a photoresist removal region of a mesh structure in a crisscross pattern, the present embodiment is not limited to this.

S203: Forming a first opening 310 penetrating the first inorganic protection layer 300 in a thickness direction in the first inorganic protection layer 300.

Figure 5C:
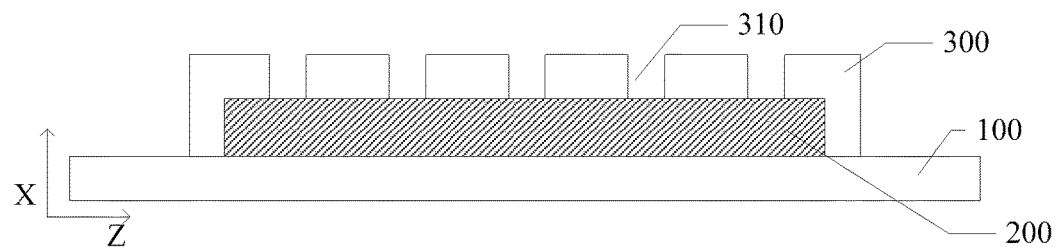

For example, as illustrated in FIG. 5c, the thickness direction is X direction which is perpendicular to the base substrate 100.

For example, with the first mask layer 302 as the resist layer, the first inorganic protection layer 300 is etched by plasma etching until it is pierced to form a sectional view as shown in FIG. 5c. In this case, the first opening 310 having the mesh structure in a crisscross pattern is formed on the first inorganic protection layer 300, the present embodiment is described by taking a case that the pattern of the first opening 310 is the pattern illustrated in FIG. 1c, but is not limited to this.

S204: Filling a first organic material 301 in the first opening 310.

For example, the first organic material 301 filled in the first opening 310 may include a combination of one or more of polyimide, polyamide, polycarbonate, epoxy resin, and the like, but not limited thereto. In the present embodiment, the bending performance of the entire package structure may be increased by filling the first inorganic protection layer with the organic material having elasticity, so as to ensure that the package structure may not break under bending force due to large stress of the first inorganic protection layer, and improving the flexibility of the display device.

Figure 5D:
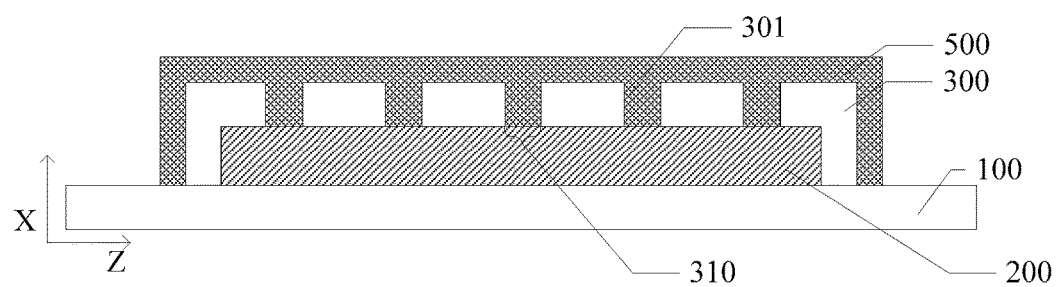

For example, as illustrated in FIG. 5d, forming a buffer layer 500 on the first inorganic protection layer 300 provided with the first opening 310. For example, the buffer layer 500 is formed on a surface of the first inorganic protection layer 300 facing away from the base substrate 100 and the lateral sides of the first inorganic protection layer 300.

For example, the present embodiment is described by taking a case that a material of the buffer layer 500 is the same as the first organic material 301, that is, the material of the buffer layer 500 is used to fill in the first opening 310, therefore, the filling of the first opening 310 and the formation of the buffer layer 500 may be completed by a one-step process, so as to save process steps. The present includes but is not limited to this, for example, the material of the buffer layer 500 may be different from the first organic material 301.

Figure 5E:
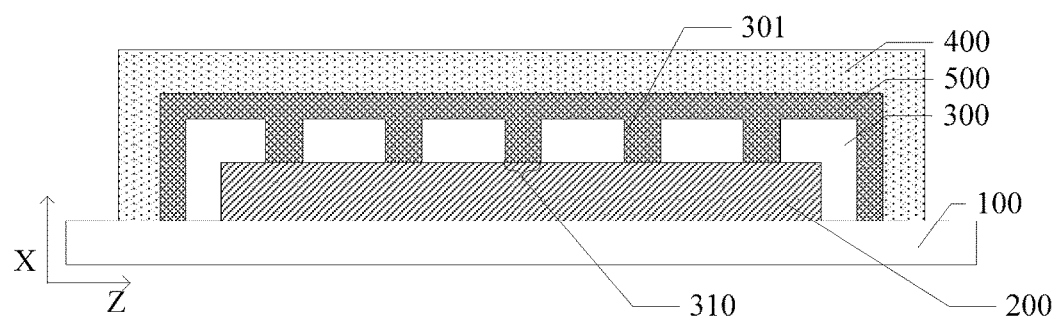

For example, as illustrated in FIG. 5e, forming a second inorganic protection layer 400 on the first inorganic protection layer 300, that is, forming the second inorganic protection layer 400 on the buffer layer 500. For example, the second inorganic protection layer 400 is disposed on a surface of the buffer layer 500 facing away from the base substrate 100 and the lateral sides of the buffer layer 500.

For example, the material of the second inorganic protection layer 400 may be silicon nitride with good barrier property to moisture and oxygen, but not limited thereto.

Figure 5F:
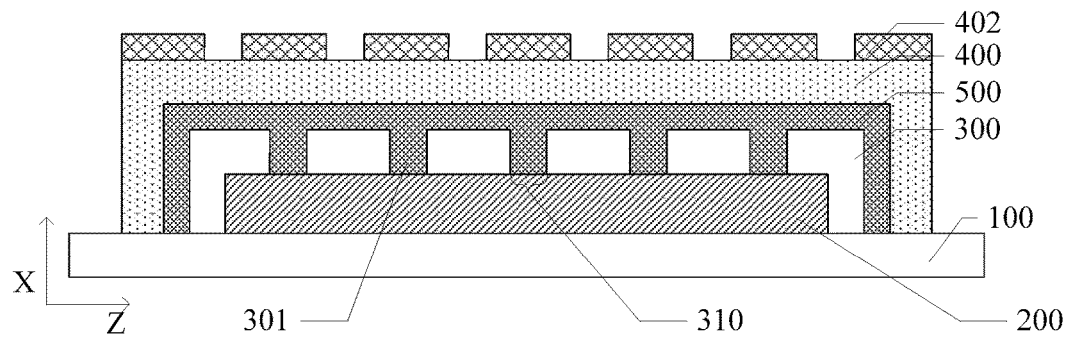

For example, as illustrated in FIG. 5f, the present embodiment is described by taking a case that coating a photoresist layer on the second inorganic protection layer 400, but is not limited to this. A second mask layer 402 is formed on the second inorganic protection layer 400 by means of exposure and development. The second mask layer 402 may comprise a photoresist removal region of a mesh structure in a crisscross pattern, the present embodiment is not limited to this.

Figure 5G:
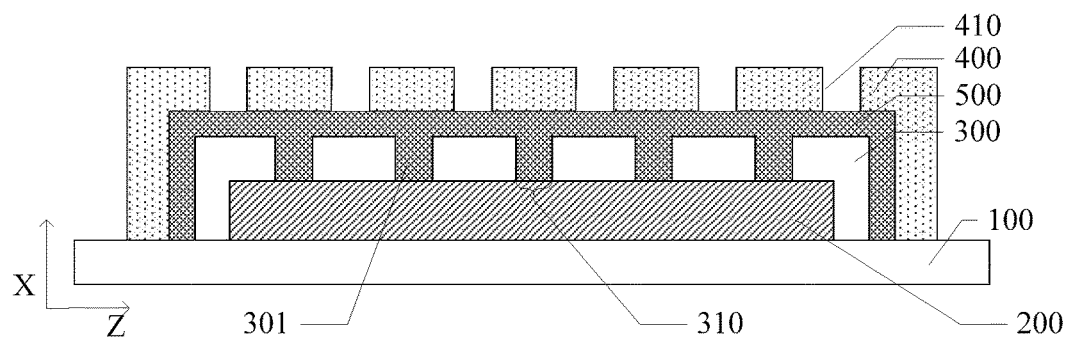

For example, with the second mask layer 402 as the resist layer, the second inorganic protection layer 400 is etched by plasma etching until it is pierced to form a sectional view as shown in FIG. 5g. That is, the second opening 410 penetrating the second inorganic protection layer 400 in the thickness direction, that is. in X direction, is formed in the second inorganic protection layer 400. In this case, the second opening 410 having the mesh structure in a crisscross pattern is formed on the second inorganic protection layer 400, the present embodiment is described by taking a case that the pattern of the second opening 410 is the pattern illustrated in FIG. 2c, but is not limited to this.

Figure 5H:
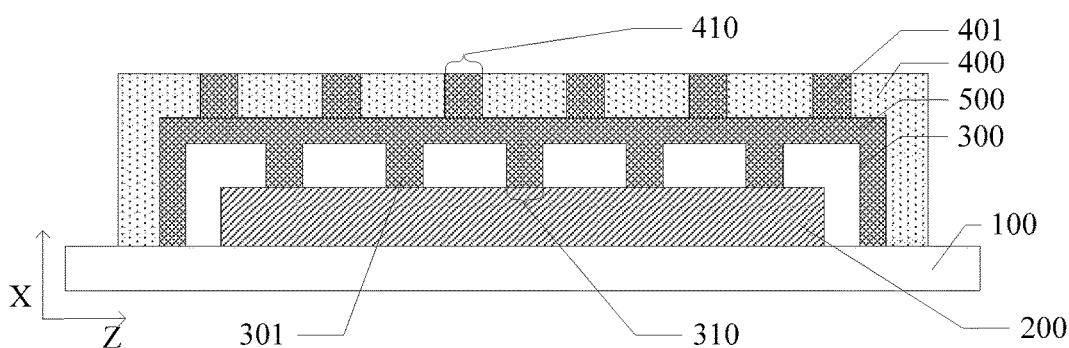

For example, as illustrated in FIG. 5h, filling the second organic material 401 in the second opening 410, that is, a layer of organic material film may be formed on the second inorganic protection layer 400, and the second opening 410 is completely filled, and then the organic thin film layer outside the second opening 410 is removed by a patterning process or a chemical mechanical polishing (CMP) so as to prevent the package structure of the organic electroluminescent device from being too thick.

For example, the second organic material 401 filled in the second opening 410 may be the same flexible organic material as the first organic material 301, and may also include other organic materials with better elasticity, the present embodiment dose not limit this. In the present embodiment, the bending performance of the entire package structure may be increased by filling the second inorganic protection layer with the organic material having elasticity, so as to ensure that the package structure may not be broken under bending force due to large stress of the second inorganic protection layer, and improving the flexibility of the display device.

For example, as illustrated in FIG. 5h, an orthogonal projection of the second opening 410 on the base substrate 100 is offset from an orthogonal projection of the first opening 310 on the base substrate 100, that is, the orthogonal projection of the second opening 410 on the base substrate 100 and the orthogonal projection of the first opening 310 on the base substrate 100 do not overlap. The manufacturing method of a package structure of an organic electroluminescent device provided by the present embodiment may reduce the fracture possibility of the first inorganic protection layer and the second inorganic protection layer, so as to improve bending performance of the package structure, and better ensuring the bending resistance performance of the flexible organic electroluminescent device. And the package structure of the organic electroluminescent device provided by the present embodiment can also prevent external moisture and oxygen intrusion invasion maximally. The present embodiment includes but is not limited to this, for example, the orthogonal projection of the second opening on the base substrate and the orthogonal projection of the first opening on the base substrate may also be overlapped.

The present embodiment provides a display device, which comprises any package structure of an organic electroluminescent device provided by an embodiment of the present disclosure. The display device provided by the present embodiment adopts the package structure of an organic electroluminescent device having the first opening and/or the second opening penetrating the first inorganic protection layer and/or the second inorganic protection layer, and filling an opening with an organic material, so that the fracture probability of the first inorganic protection layer and/or the second inorganic protection layer may be reduced, thereby effectively increasing the bending performance of the display device.

For example, the display device may be an organic electroluminescence display device and any product or component having a display function such as a television, a digital camera, a cell phone, a watch, a tablet computer, a notebook computer, a navigator and the like which includes the organic electroluminescence display device, the embodiment is not limited to this.

The following points should to be explained:

1) Unless otherwise defined, the same reference numerals in at least one embodiment and the drawings of the present disclosure represent the same meaning.

2) The drawings of at least one embodiment of the present disclosure only relate to the structure in the embodiment of the present disclosure, and other structures may be referenced to the usual design.

3) For clarity purposes, the thickness and size of a layer or microstructure are amplified in the drawings for at least one embodiment of the present disclosure. It should be understood that, in a case that a component such as a layer, a membrane, a region, or a substrate is referred to be located "over" or "down" another element, the component may be located "over" or "down" the another element "directly", or may have an intermediate element.

The above are only specific implementations of the present disclosure, and the scope of the present disclosure is not limited thereto, the scope of the present disclosure should be based on the scope of the claims.

What is claimed is:

1. A package structure of an organic electroluminescent device, comprising:
   a base substrate;
   an organic electroluminescent unit, disposed on the base substrate;
   a first inorganic protection layer, disposed on the organic electroluminescent unit;

a second inorganic protection layer, disposed on the first inorganic protection layer, wherein the first inorganic protection layer is provided with a first opening penetrating the first inorganic protection layer in a thickness direction, and the first opening is filled with a first organic material;

the second inorganic protection layer is provided with a second opening penetrating the second inorganic protection layer in the thickness direction, and the second opening is filled with a second organic material;

the first opening comprises a plurality of first sub-openings arranged in a plurality of rows, the second opening comprises a plurality of second sub-openings arranged in a plurality of rows, at least one selected from the group consisting of the first sub-openings and the second sub-openings of adjacent rows is offset from each other in a row direction.

2. The package structure of the organic electroluminescent device according to claim 1, wherein an orthogonal projection of the second opening on the base substrate is offset from an orthogonal projection of the first opening on the base substrate.

3. The package structure of the organic electroluminescent device according to claim 1, wherein the first inorganic protection layer is disposed on a surface of the organic electroluminescent unit facing away from the base substrate and lateral sides of the organic electroluminescent unit, the second inorganic protection layer is disposed on a surface of the first inorganic protection layer facing away from the base substrate and lateral sides of the first inorganic protection layer.

4. The package structure of the organic electroluminescent device according to claim 1, further comprising:

a buffer layer, disposed between the first inorganic protection layer and the second inorganic protection layer.

5. The package structure of the organic electroluminescent device according to claim 4, wherein a material of the buffer layer is the same as at least one of the first organic material and the second organic material.

6. A display device, comprising the package structure of the organic electroluminescent device according to claim 1.

7. A manufacturing method of a package structure of an organic electroluminescent device, comprising:

forming an organic electroluminescent unit on a base substrate;

forming a first inorganic protection layer on the organic electroluminescent;

forming a first opening penetrating the first inorganic protection layer in a thickness direction in the first inorganic protection layer;

filling a first organic material in the first opening;

forming a second inorganic protection layer on the first inorganic protection layer;

forming a second opening penetrating the second inorganic protection layer in the thickness direction in the second inorganic protection layer; and filling a second organic material in the second opening, wherein the first opening comprises a plurality of first sub-openings arranged in a plurality of rows, the second opening comprises a plurality of second sub-openings arranged in a plurality of rows, at least one selected from the group consisting of the first sub-openings and the second sub-openings of adjacent rows is offset from each other in a row direction.

8. The manufacturing method of the package structure of the organic electroluminescent device according to claim 7, wherein, before forming the second inorganic protection layer, the method further comprises:

forming a buffer layer on the first inorganic protection layer.

* * * * *